(12) United States Patent
Takahashi

(10) Patent No.: US 7,998,811 B2
(45) Date of Patent: Aug. 16, 2011

(54) SEMICONDUCTOR DEVICE AND METHOD FOR SEMICONDUCTOR DEVICE

(75) Inventor: Shinya Takahashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/926,676

(22) Filed: Dec. 3, 2010

(65) Prior Publication Data

US 2011/0076834 A1    Mar. 31, 2011

Related U.S. Application Data

(62) Division of application No. 11/449,827, filed on Jun. 9, 2006, now Pat. No. 7,863,668.

(30) Foreign Application Priority Data

Jun. 10, 2005    (JP) ................................ 2005-171306

(51) Int. Cl.
*H01L 21/336* (2006.01)
*H01L 21/8238* (2006.01)
*H01L 21/8234* (2006.01)

(52) U.S. Cl. ........ 438/257; 438/199; 438/207; 438/211; 438/218; 438/197; 257/E21.632; 257/E21.642; 257/E21.645; 257/E21.685; 257/E21.687

(58) Field of Classification Search ........... 257/E21.632, 257/E21.642, E21.645, E21.659, E21.685, 257/E21.687
See application file for complete search history.

(56) References Cited

U.S. PATENT DOCUMENTS

| 5,742,670 A | 4/1998 | Bennett |
| 5,946,230 A | 8/1999 | Shimizu et al. |
| 2002/0151141 A1* | 10/2002 | Tuan et al. ................ 438/279 |
| 2004/0047217 A1 | 3/2004 | Kamiya |
| 2004/0145020 A1 | 7/2004 | Kang et al. |
| 2004/0190339 A1* | 9/2004 | Shukuri et al. ........... 365/185.05 |
| 2005/0035397 A1 | 2/2005 | Otoi et al. |
| 2005/0041477 A1 | 2/2005 | Lee et al. |
| 2005/0237842 A1 | 10/2005 | Takeuchi et al. |
| 2005/0280074 A1* | 12/2005 | Kodama ........................ 257/315 |
| 2007/0228449 A1* | 10/2007 | Takano et al. ................. 257/314 |

FOREIGN PATENT DOCUMENTS

| JP | 10-27891 | 1/1998 |
| JP | 11-097652 | 4/1999 |
| JP | 2001-110920 | 4/2001 |
| JP | 2002-359308 | 12/2002 |
| JP | 2004-111917 | 4/2004 |

OTHER PUBLICATIONS

Notice of Reasons for Rejection mailed Feb. 16, 2010 by Japanese Patent Office in Japanese counterpart application No. 2005-171306.
Notice of Reasons for Rejection mailed May 10, 2011, in JP 2005-171306.

* cited by examiner

*Primary Examiner* — Mohsen Ahmadi
(74) *Attorney, Agent, or Firm* — Finnegan, Henderson, Farabow, Garrett & Dunner, L.L.P.

(57) ABSTRACT

A semiconductor device includes a semiconductor substrate, a memory cell region provided on the semiconductor substrate, a word line provided on the memory cell region, a first gate insulating film provided in the memory cell region beneath the word line, a first floating gate electrode provided on the first gate insulating film, a second gate insulating film provided in the memory cell region beneath the word line, the second gate insulating film being different from the first gate insulating film in thickness, and a second floating gate electrode provided on the second gate insulating film.

4 Claims, 11 Drawing Sheets

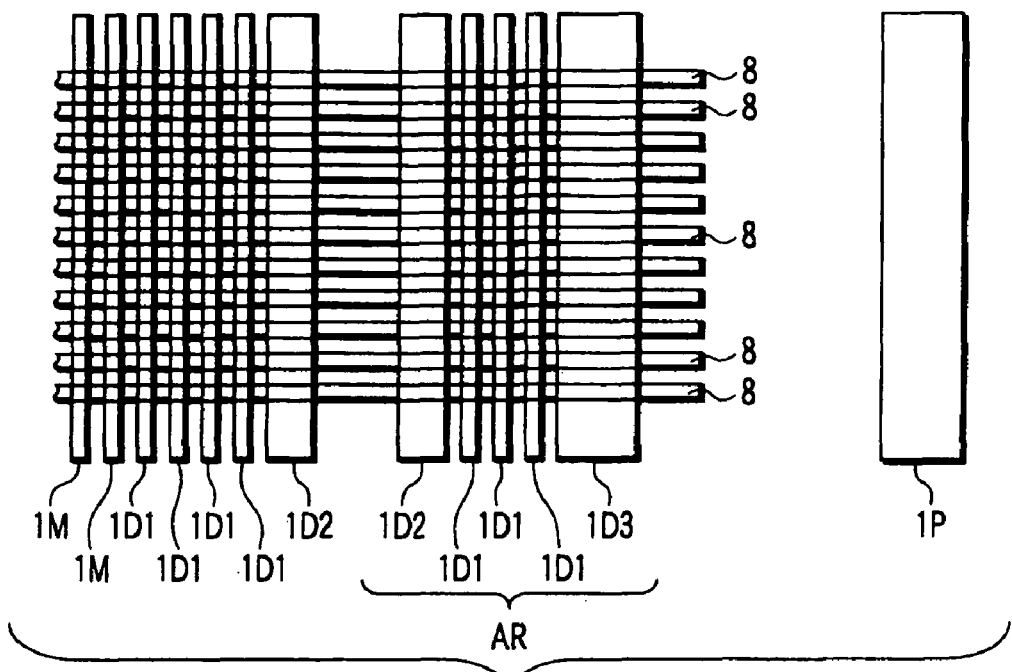
F I G. 16
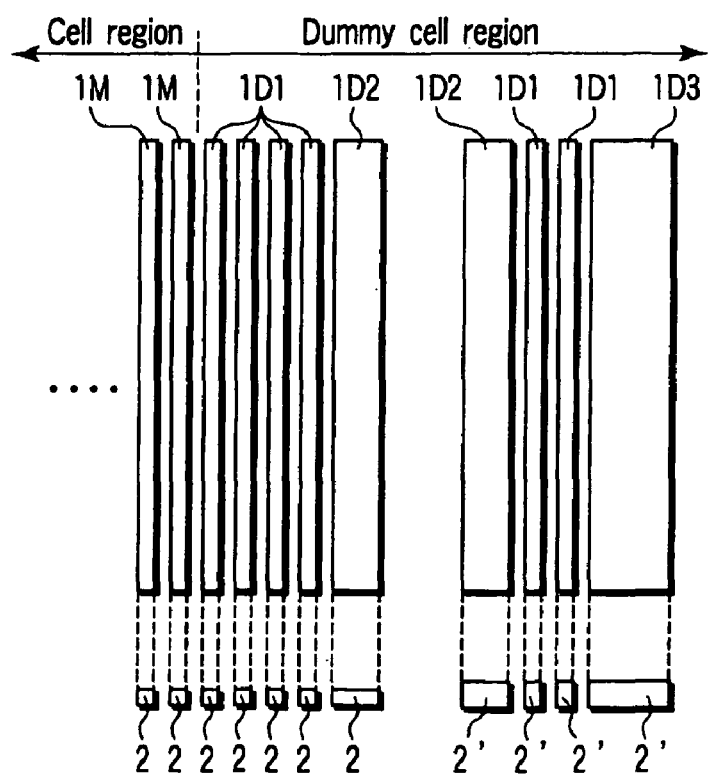
F I G. 17

SEMICONDUCTOR DEVICE AND METHOD FOR SEMICONDUCTOR DEVICE

This application is a division of application Ser. No. 11/449,827, filed Jun. 9, 2006 now U.S. Pat. No. 7,863,668, which is based upon and claims the benefit of priority from prior Japanese Patent Application No. 2005-171306, filed Jun. 10, 2005, the entire contents of both of which are incorporated herein by reference.

CROSS-REFERENCE TO RELATED APPLICATIONS

This application is based upon and claims the benefit of priority from prior Japanese Patent Application No. 2005-171306, filed Jun. 10, 2005, the entire contents of which are incorporated herein by reference.

BACKGROUND OF THE INVENTION

1. Field of the Invention

The present invention relates to a semiconductor device and method for the semiconductor device including a nonvolatile semiconductor memory.

2. Description of the Related Art

A NAND type flash memory is known as one of nonvolatile semiconductor memories (Jpn. Pat. Appln. KOKAI Publication No. 2002-359308). The NAND type flash memory comprises a memory cell region and a peripheral circuit region provided at outer periphery of the memory cell region. Among the highly downsized NAND type flash memories, there is a commercially available NAND type flash memory which includes a dummy cell region provided at the periphery of the memory cell array region.

The dummy cell region is a region which is provided for ensuring required lithography margin. That is, if no dummy cell region exists, an active area at an edge of the memory cell array region can not be formed in the minimum dimension because of lithography margin.

It is in a similar situation even in the NAND type flash memory including a dummy cell region, if downsizing further advances in the future, there is a concern that device characteristic is lowered in the memory cell region too.

BRIEF SUMMARY OF THE INVENTION

According to an aspect of the present invention, there is provided a semiconductor comprising: a semiconductor substrate; a memory cell region provided on the semiconductor substrate and including a memory cell array region and a dummy cell region; a word line provided on the memory cell region; a first gate insulating film provided on the semiconductor substrate in the memory cell array region beneath the word line; a first floating gate electrode provided on the first gate insulating film; a second gate insulating film provided on the semiconductor substrate in the dummy cell region beneath the word line, the second gate insulating film being different from the first gate insulating film in thickness; a second floating gate electrode provided on the second gate insulating film; a control gate electrode provided above the first and second floating gate electrodes and connected to the word line; and a gate interelectrode insulating film provided between the first and second floating gate electrodes and the control gate electrode.

According to an aspect of the present invention, there is provided a method for manufacturing a semiconductor comprising: forming first and second gate insulating films on memory cell and dummy cell regions of a semiconductor device respectively, the first and second gate insulating films being different in thickness; forming a first conductive film on the first and second gate insulating films; forming a resist pattern on the first conductive film; forming first and second floating gate electrodes formed of the first conductive film on the first and second gate insulating films respectively by etching the first conductive film using the resist pattern as a mask; forming an isolation trench on a surface of the semiconductor substrate by etching the first gate insulating film, the second gate insulating film and the semiconductor substrate using the resist pattern as a mask; forming an isolation insulating film in the isolation film; forming a gate interelectrode insulating film on top surfaces of the first floating gate electrode, the second floating gate electrode and the isolation insulating film; forming a second conductive film on the gate interelectrode insulating film; and forming a control gate electrode and a world line which are formed of the second conductive film by etching the second conductive film, the control gate electrode being provided above the first and second floating gates via the gate interelectrode insulating film, the world line being connected to the control gate.

BRIEF DESCRIPTION OF THE SEVERAL VIEWS OF THE DRAWING

FIG. 16 is a plan view showing a modified example of the present embodiment;

FIG. 17 is a view showing a width of a plurality of active areas in a dummy cell region and thickness of a tunnel gate insulating film of an embodiment;

DETAILED DESCRIPTION OF THE INVENTION

Now, embodiments of the present invention will be described with reference to the accompanying drawings.

First Embodiment

Figure 1:
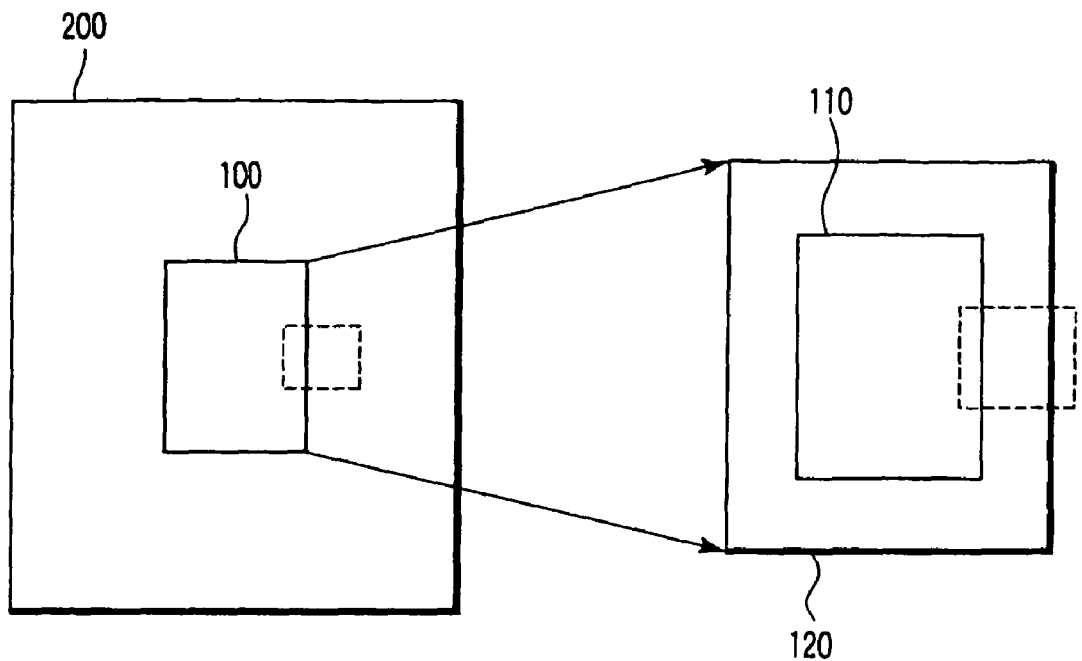
FIG. 1 is a plan view showing a NAND type flash memory according to a first embodiment of the present invention.

FIG. 1 is a plan view showing a NAND type flash memory according to a first embodiment of the present invention.

The NAND type flash memory comprises a memory cell region 100 and a peripheral circuit region 200 provided at outer periphery of the memory cell region 100. The memory cell region 100 comprises a memory cell array region 110 and a dummy cell region 120 provided at periphery of the dummy cell region 120.

The dummy cell region 120 is a region which is provided for ensuring required lithography margin. That is, if no dummy cell region 120 exists, an active area at an edge of the memory cell array region 110 is not formed in the minimum dimension because of lithography margin. Arbitrary data cannot be written into the dummy cell region 120. This is accomplished by not forming a source/drain region in the dummy cell region 120.

A pattern of the active area in the memory cell array region 110 is a line and space (L & S) pattern. The active area in the memory cell array region 110 is formed in the minimum dimension. A pattern of an active area in the dummy cell region 120 is also L & S. However, the dummy cell region 120 includes an active area formed in dimension that is greater than the minimum dimension.

Figure 2:
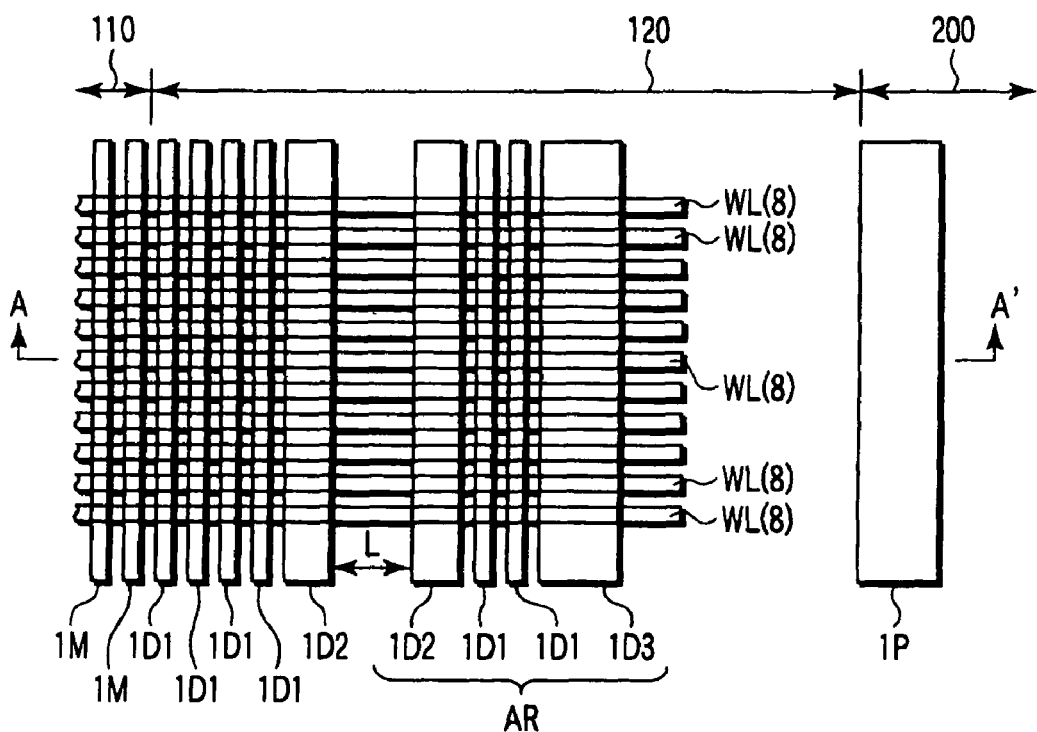
FIG. 2 is a plan view showing a layout in a region surrounded by the dashed line shown in FIG. 1.

FIG. 2 is a plan view showing a layout in a region surrounded by the dashed line shown in FIG. 1.

The memory cell array region 110 comprises a plurality of line shaped active areas 1M. The width and interval of these active areas 1M are obtained in the minimum dimension.

The dummy cell area 120 comprises a plurality of active areas 1D1, 1D2, and 1D3. The width of the active area 1D1 is obtained in the minimum dimension. The width of the active areas 1D2 and 1D3 is greater than the minimum dimension. The width of the active area 1D3 is wider than that of the active area 1D2.

A magnitude relationship in width of the active areas 1D1, 1D2, and 1D3 is the width of the active area 1D1<the width of the active area 1D2<the width of the active area 1D3. The width of each of the active areas 1D1, 1D2, and 1D3 is selected based on a relationship in lithography margin.

A word line WL is provided on the memory cell array region 110 and the dummy cell region 120. The world line WL is connected to control gate electrodes in the memory cell array region 110 and the dummy cell region 120. The world line WL is in common with the control gate on the floating gate.

The active areas 1D3, 1D1, 1D1, and 1D2, although not shown, may follow in the dummy cell area 120 at the right side in a region AR shown in FIG. 2. That is, in a region distant from the region AR by a predetermined distance, a plurality of active areas having a mirror-image relationship with a plurality of active areas in the region AR may be arranged.

In FIG. 2, 1P denotes an active area in the peripheral circuit region 200.

Figure 3:
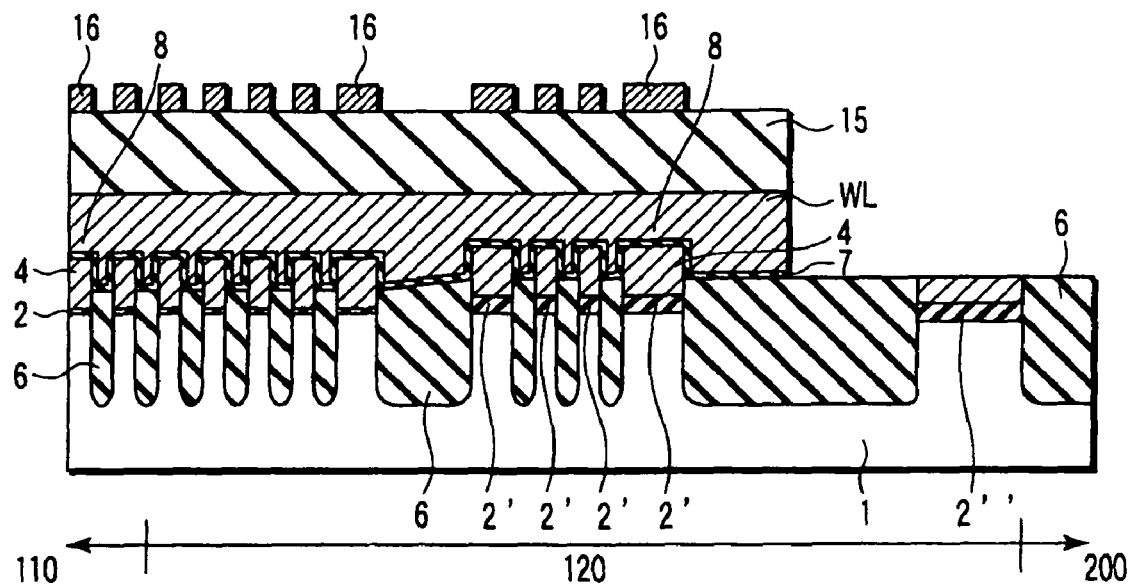
FIG. 3 is a sectional view taken along the line A-A' shown in FIG. 2.

FIG. 3 is a sectional view taken along the line A-A' shown in FIG. 2.

In FIG. 3, reference numeral 1 denotes a silicon substrate, reference numerals 2 and 2' each denote a tunnel gate insulating film, reference numeral 4 denotes a floating gate electrode, reference numeral 6 denotes an STI (Shallow Trench Isolation) insulating film (isolation insulating film), reference numeral 7 denotes a gate interelectrode insulating film (interpoly insulating film), reference numeral 8 (WL) denotes a control gate electrode (word line), reference numeral 15 denotes an interlayer insulating film, and reference numeral 16 denotes a bit line. The world line WL is in common with the control gate 8 on the floating gate 4.

The NAND type flash memory of the present embodiment comprises a silicon substrate 1, a memory cell region including a memory cell array region 110 and a dummy cell region 120 provided on the silicon substrate 1, and a word line WL provided on the memory cell region.

In the memory cell array region 110 beneath the word line WL, there exist a tunnel gate insulating film (first gate insulating film) 2 provided on the silicon substrate 1, and a floating gate electrode (first floating gate electrode) 4 provided on the tunnel gate insulating film 2.

In the dummy cell region 120 beneath the word line WL, there exist a tunnel gate insulating film 2' (second gate insulating film) which is different from the tunnel gate insulating film 2 in thickness and provided on the silicon substrate 1, and a floating gate electrode (second floating gate electrode) 4 provided on the tunnel gate insulating film 2'.

Here, the tunnel gate insulating film 2' is thicker than the tunnel gate insulating film 2. The tunnel gate insulating film 2' has thickness equal to that of a gate insulating film of a MOS transistor which is to be applied a high power supply voltage for instance, and is specifically 40 nm in thickness. Although the tunnel gate insulating film 2' does not always function well as a tunnel gate insulating film, this film is referred to as a tunnel gate insulating film for convenience sake.

The control gate electrode 8 is provided above the floating gate electrodes (first and second floating gate electrodes) 4 in the memory cell array region 110 and the dummy cell region 120. The word line WL and the control gate electrode 8 are formed by processing the same conductive film (for example, polycrystalline silicon film including dopants).

A gate interelectrode insulating film 7 is provided between the floating gate electrodes (first and second floating gate electrodes) 4 in the memory cell array region 110 and the dummy cell region 120 and the control gate electrode 8.

In FIG. 3, reference numeral 2" denotes a gate insulating film of an active area in the peripheral circuit region 200.

Figure 4:
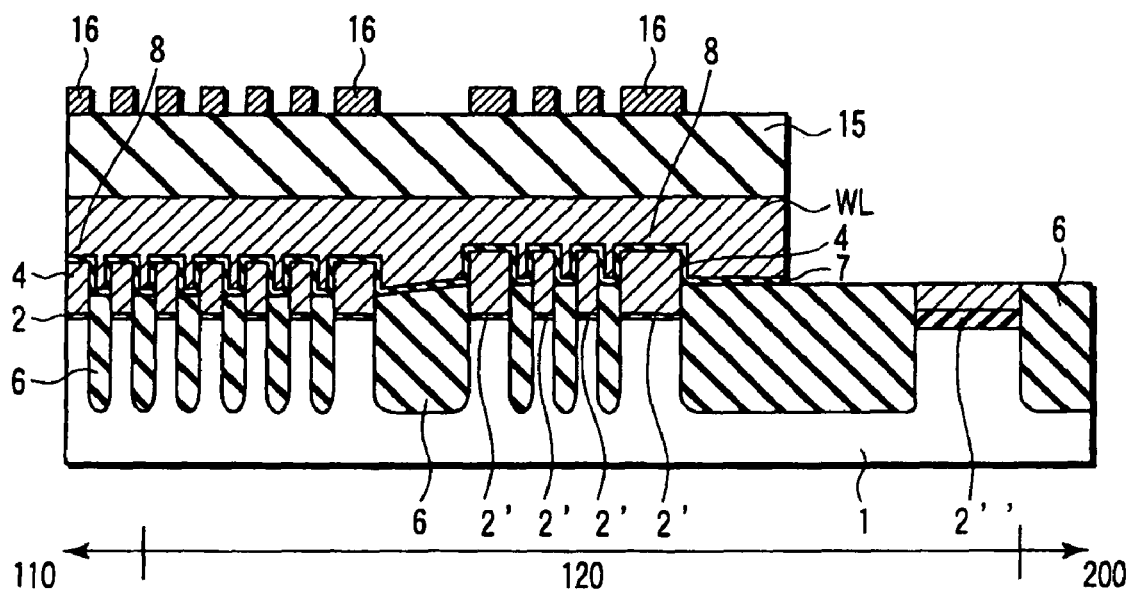
FIG. 4 is a sectional view showing a NAND type flash memory according to comparative example.
Figure 5:
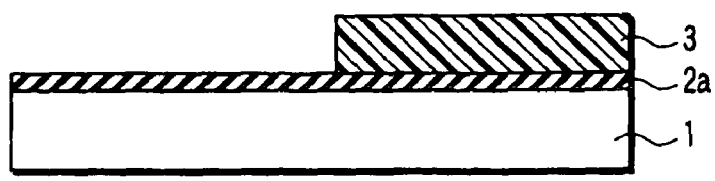
FIG. 5 is a sectional view showing a step of manufacturing the NAND type flash memory of the first embodiment.
Figure 6:
FIG. 6 is a sectional view showing a step of manufacturing the NAND type flash memory of the first embodiment following the FIG. 5.
Figure 7:
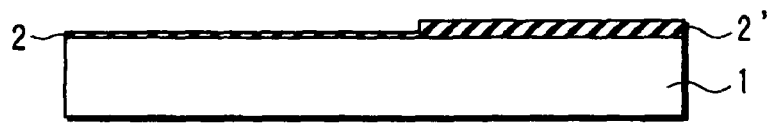
FIG. 7 is a sectional view showing a step of manufacturing the NAND type flash memory of the first embodiment following the FIG. 6.
Figure 8:
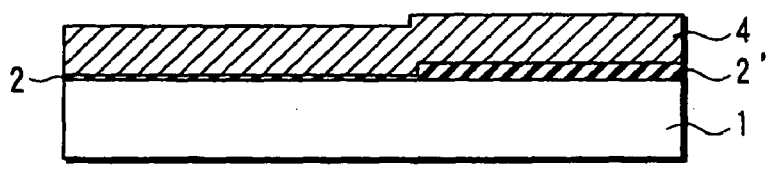
FIG. 8 is a sectional view showing a step of manufacturing the NAND type flash memory of the first embodiment following the FIG. 7.
Figure 9:
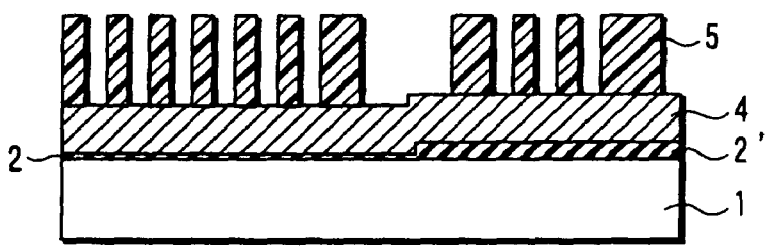
FIG. 9 is a sectional view showing a step of manufacturing the NAND type flash memory of the first embodiment following the FIG. 8.
Figure 10:
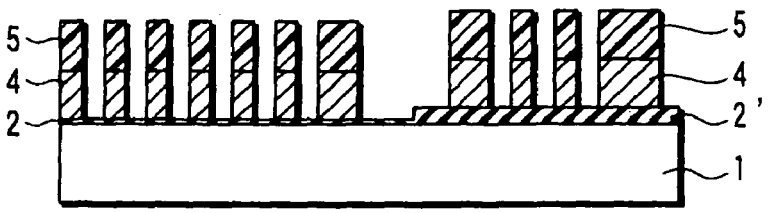
FIG. 10 is a sectional view showing a step of manufacturing the NAND type flash memory of the first embodiment following the FIG. 9.
Figure 11:
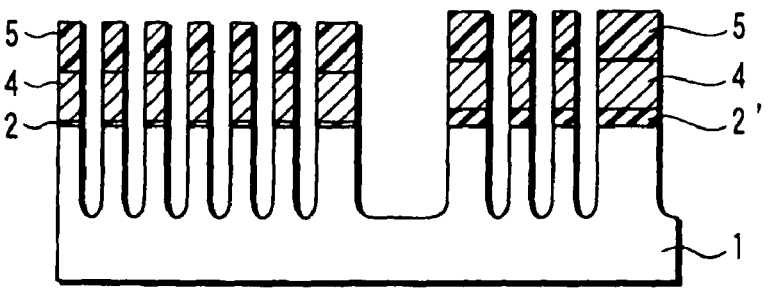
FIG. 11 is a sectional view showing a step of manufacturing the NAND type flash memory of the first embodiment following the FIG. 10.
Figure 12:
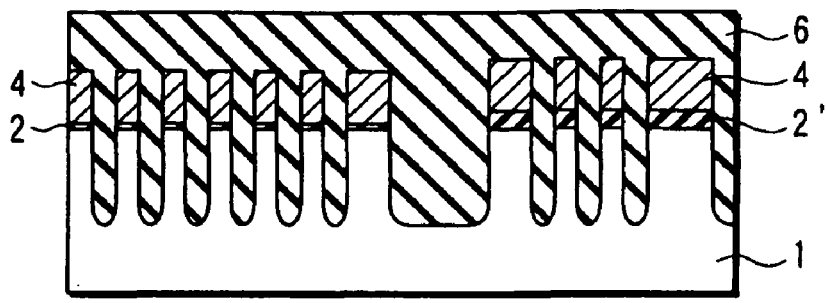
FIG. 12 is a sectional view showing a step of manufacturing the NAND type flash memory of the first embodiment following the FIG. 11.
Figure 13:
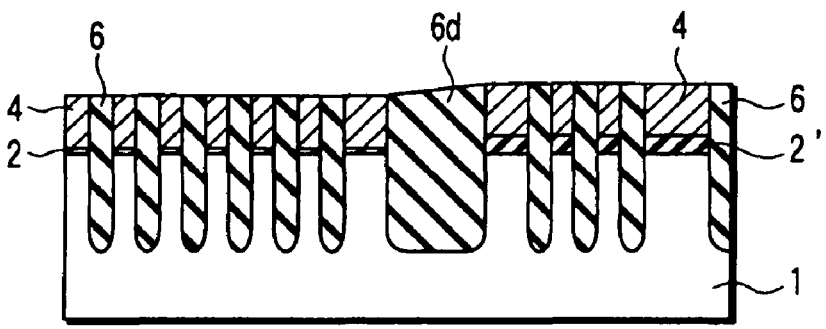
FIG. 13 is a sectional view showing a step of manufacturing the NAND type flash memory of the first embodiment following the FIG. 12.
Figure 14:
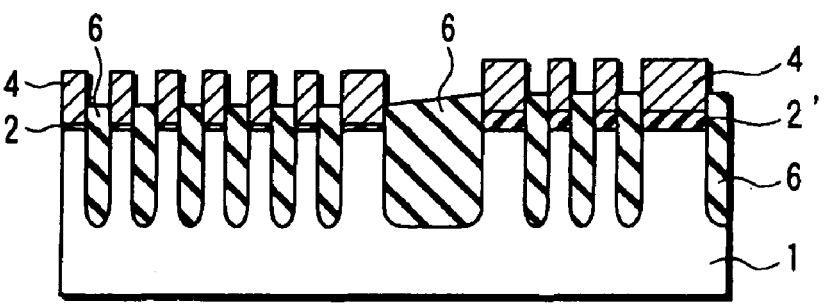
FIG. 14 is a sectional view showing a step of manufacturing the NAND type flash memory of the first embodiment following the FIG. 13.
Figure 15:
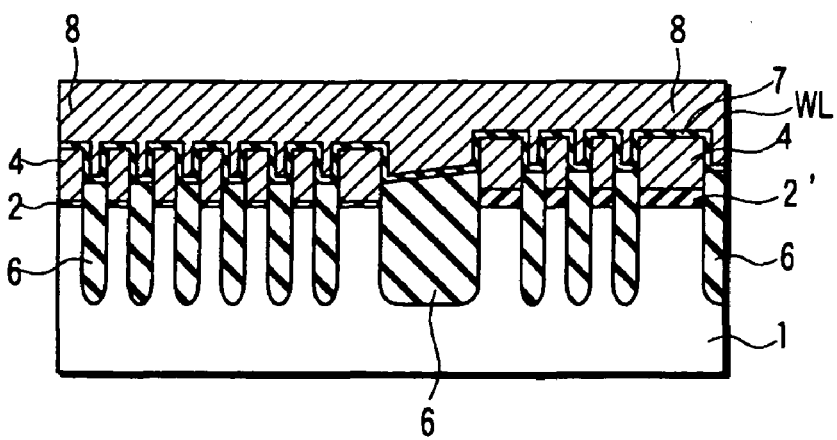
FIG. 15 is a sectional view showing a step of manufacturing the NAND type flash memory of the first embodiment following the FIG. 14.

FIG. 4 is a sectional view showing a NAND type flash memory of a comparative example. In the comparative example, the thickness of the tunnel gate insulating film 2' in the dummy cell region 120 beneath the word line WL is equal to that of the tunnel gate insulating film 2 in the memory cell array region 110.

In the case of comparative example, an active area whose width is larger than that of the active area in the memory cell array region 110 exists in the dummy cell region 120. A coupling ratio in the dummy cell region 120 of this wider portion is smaller than a coupling ratio in the memory cell array region 110. Thus, an electric field applied to the tunnel gate insulating film 2 in the dummy cell region 120 whose coupling ratio is small becomes large. The large electric field applied to the tunnel gate insulating film 2 adversely affects the memory cell array region 110. For example, a leak current increases in the memory cell array region 110. For example, leakage current (current passing through the tunnel insulating film 2 at the time of writing) increases.

The coupling ratio is given by C=C2/(C1+C2)
C: Coupling ratio
C1: Capacitance between silicon substrate and floating gate electrode
C2: Capacitance between control gate electrode and floating gate electrode In contrast, in the case of the present embodiment, in the dummy cell region 120 having a wider active area, there exists a tunnel gate insulating film 2' that is thicker than the tunnel gate insulating film 2 in the memory cell array region 110. The thickness of the tunnel gate insulating film 2' is selected so that the coupling ratio in the dummy cell region 120 is greater than the coupling ratio in the memory cell array region 110, whereby the lowering of the coupling ratio in the dummy cell region 120 is restricted. Therefore, an increase in the leak current of the memory cell array region 110 caused by the dummy cell region 120 for ensuring lithography margin (deterioration of device characteristic) is restricted.

FIGS. 5 to 15 are sectional views each showing the step of manufacturing the NAND type flash memory of the present embodiment.

[FIG. 5]

A tunnel gate insulating film 2a is formed on the silicon substrate 1 by oxidization. Here, the thickness of the tunnel gate insulating film 2a is 38 nm. A resist pattern 3 is formed on the tunnel gate insulating film 2a in the dummy cell region by lithography process.

[FIG. 6]

With the resist pattern 3 using as a mask, the tunnel gate insulating film 2a is etched by wet etching whereby the tunnel gate insulating film 2a on the memory cell array region is removed. At this time, wet etching is isotropic etching, and thus, the tunnel gate insulating film 2a beneath the resist pattern 3 is slightly removed. As a result of the above step, a part of a surface of the silicon substrate 1 is exposed.

[FIG. 7]

The resist pattern 3 is removed, thereafter, an oxidization process is performed. By this oxidization process, a tunnel gate insulating film 2 is formed on the exposed surface of the silicon substrate 1. Here, the thickness of the tunnel gate insulating film 2 is 8 nm. At this time, the tunnel gate insulating film 2a (38 nm) formed in advance on the silicon substrate 1 is oxidized by 2 nm. As a result, a tunnel gate insulating film 2' having thickness of 40 nm is formed.

[FIG. 8]

A polycrystalline silicon film 4 including dopants to be processed into a floating gate electrode is formed on the tunnel gate insulating film 2 by CVD process.

[FIG. 9]

A resist pattern 5 for forming the floating gate electrode and trench (isolation trench) is formed on the polycrystalline silicon film 4 by lithography process.

[FIG. 10]

With the resist pattern 5 using as a mask, the polycrystalline silicon film 4 is etched by dry etching whereby floating the gate electrode 4 is formed. The dry etching is RIE (Reactive Ion Etching), for example.

[FIG. 11]

With the resist pattern 5 using as a mask, the tunnel gate insulating film 2, the silicon substrate 1 are etched whereby a trench (isolation trench) is formed and the tunnel gate insulating film 2 having a predetermined shape is formed.

[FIG. 12]

The resist pattern 5 is removed, thereafter, an isolation insulating film 6 having thickness such that the trench can be embedded is formed on a whole surface by CVD process. The isolation insulating film 6 is a silicon oxide film, for example. This silicon oxide film is formed by coating method using a solution that contains a perhydrate silazane polymer, for example.

[FIG. 13]

The isolation insulating film 6 is polished by CMP (Chemical Mechanical Polishing) process whereby a surface of the floating gate electrode 4 is exposed.

[FIG. 14]

The isolation insulating film 6 is etched by dry etching process (for example, RIE process) whereby a side surface of the upper side of the floating gate electrode 4 is exposed.

[FIG. 15]

A gate interelectrode insulating film 14 is formed on the entire surface by CVD process, and the exposed surface (upper surface or side surface) of the floating gate electrode 4 is covered with the gate interelectrode insulating film 7. In the case of the present embodiment, the exposed surface (upper surface or side surface) of the floating gate electrode 4 also contributes to a capacitor. This leads to an increase of the coupling ratio in the dummy cell region.

Thereafter, the NAND type flash memory shown in FIG. 3 is completed through the well known steps such as a step of forming the control gate electrode 8 and world line WL, a step of forming an interlayer insulating film 15, and a step of forming a bit line 16. The control gate 8 and the world line WL are formed by processing the common conductive film. The conductive film is, for example, a polycrystalline silicon film or a stacked film of polycrystalline silicon film and silicide film.

In the present embodiment, two active areas 1D are provided between an active area 1D2 and an active area 1D3 in a region AR shown in FIG. 2, however, three active areas 1D may be provided as shown in FIG. 16, and further, four or more active areas 1D may be provided.

Figure 18:
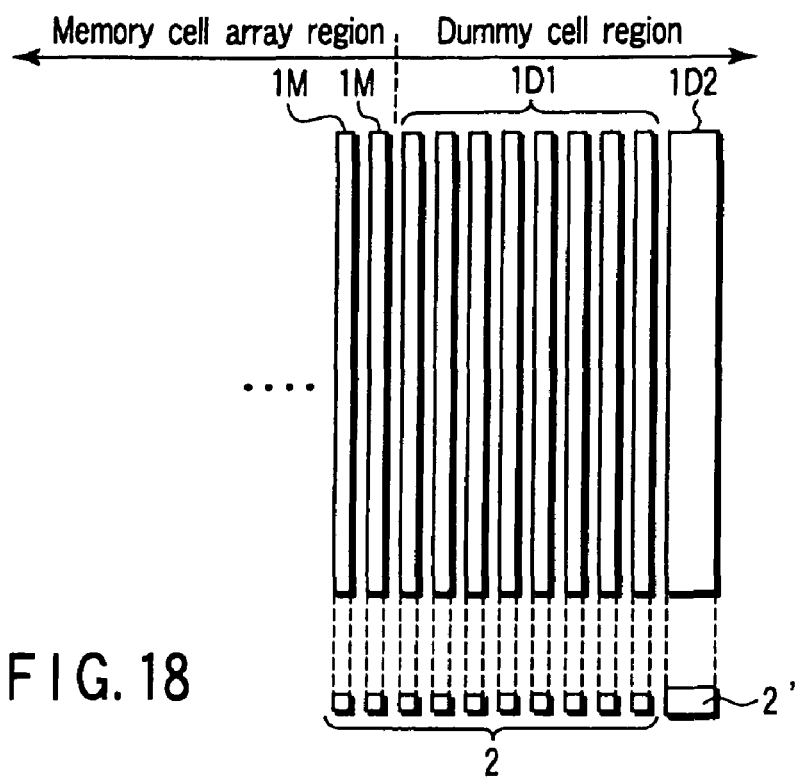
FIG. 18 is a view showing a width of a plurality of active areas in a dummy cell region and thickness of a tunnel gate insulating film of a modified example of the embodiment.
Figure 19:
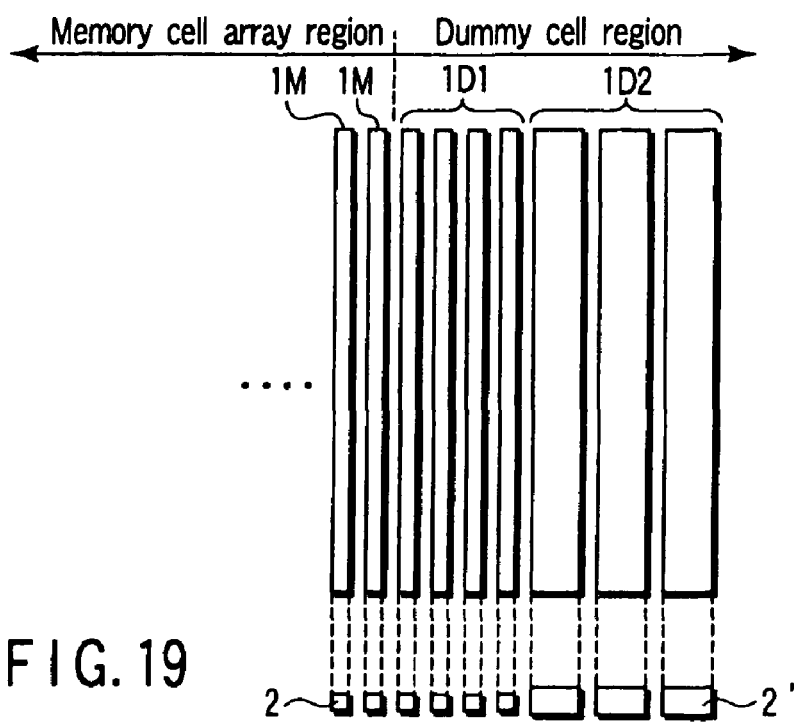
FIG. 19 is a view showing a width of a plurality of active areas in a dummy cell region and thickness of a tunnel gate insulating film of another modified example of the embodiment.

In addition, in the present embodiment, the width of the plurality of active areas in the dummy cell region and the thickness of the tunnel gate insulating film are selected as shown in FIG. 17, however, the width of the active area and the thickness of the tunnel gate insulating film may be selected as shown in FIG. 18 or 19.

In the case of FIG. 18, with respect to the width of the active area, the width of the outermost active area 1D2 in the dummy cell region is large, and the width of the remaining active area 1D1 is small. The width of the active area 1D1 in the dummy cell region is equal to the width of the active area 1M in the memory cell array region (for example, minimum dimension).

On the other hand, with respect to the thickness of the tunnel gate insulating film, the tunnel gate insulating film 2 in the active area 1D2 is thick, and the tunnel gate insulating film 2' in the active area 1D1 is thin. The thickness of the tunnel gate insulating film 2 in the active area 1D1 in the dummy cell region is equal to the thickness of the tunnel gate insulating film 2 in the active area 1M in the memory cell array region.

In the case of FIG. 19, with respect to the width of the active area, the width of a plurality of active areas 1D1 at a side adjacent to the memory cell array region is small, and the width of a plurality of the remaining active areas 1D2 is large. The width of the active area 1D1 in the dummy cell region is equal to the width of the active area 1M in the memory cell array region (for example, minimum dimension).

On the other hand, with respect to the thickness of the tunnel gate insulating film, the tunnel gate insulating film 2 in the active area 1D1 is thick, and the tunnel gate insulating film 2' in the active area 1D2 is thin. The thickness of the tunnel gate insulating film 2 in the active area 1D2 in the dummy cell region is equal to the thickness of the tunnel gate insulating film 2 in the active area 1M of the memory cell array region.

Second Embodiment

Figure 20:
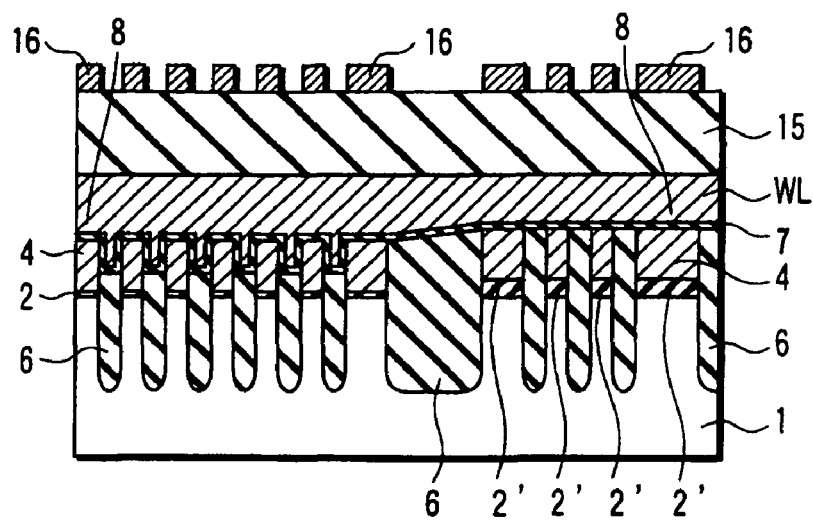
FIG. 20 is a sectional view showing a NAND type flash memory according to a second embodiment of the present invention.

FIG. 20 is a sectional view showing a NAND type flash memory according to a second embodiment of the present invention. Like constituent elements corresponding to those shown in the already explained figures are designated by like reference numerals. A detailed description thereof is omitted here.

The present embodiment is different from the first embodiment in that the gate interelectrode insulating film 7 is not provided on a side surface of the upper side of the floating gate electrode 4 on the thick tunnel gate insulating film 2' in the dummy cell region. That is, in the dummy cell region 120, with respect to the floating gate electrode 4, only the its upper face is covered with the gate interelectrode insulating film 7.

In the present embodiment as well, the tunnel gate insulating film 2' in the dummy cell region is thicker than the tunnel gate insulating film 2 in the memory cell array region, and thus, the advantageous effect similar to that of the first embodiment is attained.

Figure 21:
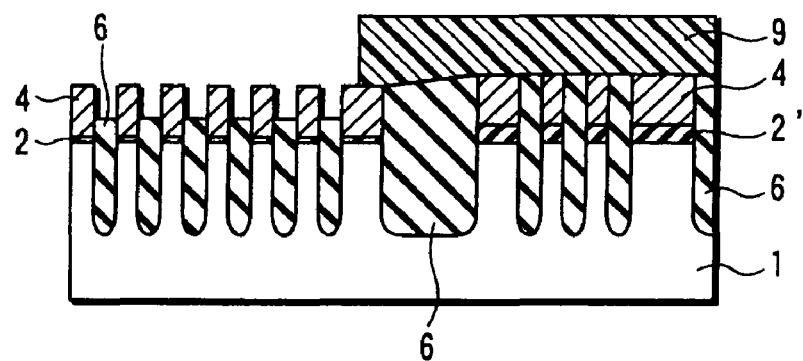
FIG. 21 is a sectional view showing a step of manufacturing the NAND type flash memory of the second embodiment.
Figure 22:
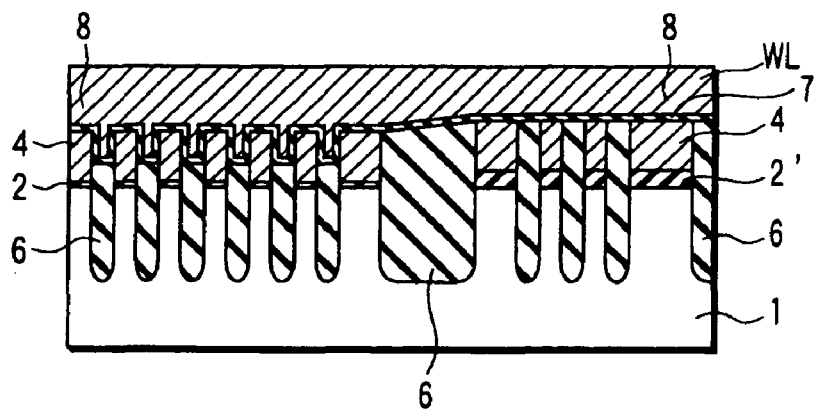
FIG. 22 is a sectional view showing a step of manufacturing the NAND type memory of the second embodiment following the FIG. 21.

FIGS. 21 and 22 are cross sections each showing a step of manufacturing the NAND type flash memory of the present embodiment. The steps common to those relevant to the NAND type flash memory of the first embodiment will be described with reference to the accompanying drawings used in the first embodiment.

[FIGS. 5 to 13]

The steps shown in FIGS. 5 to 13 described in the first embodiment are carried out.

[FIG. 21]

A resist pattern 9 is formed on a part of the dummy cell region. The resist pattern 9 covers a region of the dummy cell region on which the tunnel gate insulating film 2' is formed. The resist pattern 9 also covers the wide isolation insulating film 6. With the resist pattern 9 using as a mask, the isolation insulating film 6 is etched whereby a side surface of the upper side of the floating gate electrode 4 on the tunnel gate insulating film 2 is exposed. The etching of the isolation insulating film 6 is carried out by dry etching process (for example, RIE process).

[FIG. 22]

The resist pattern 9 is removed. A gate interelectrode insulating film 7 is formed on the entire surface by CVD process, and the exposed surface (upper surface or side surface) of the floating gate electrode 4 is covered with the gate interelectrode insulating film 7.

Thereafter, the NAND type flash memory shown in FIG. 20 is completed through the well known steps such as the step of forming the control gate electrode 8, the step of forming the interlayer insulating film 15, and the step of forming a bit line 16.

In the present embodiment as well, as in the first embodiment, the modifications shown in FIGS. 16, 18, and 19 can be applicable.

Third Embodiment

Figure 23:
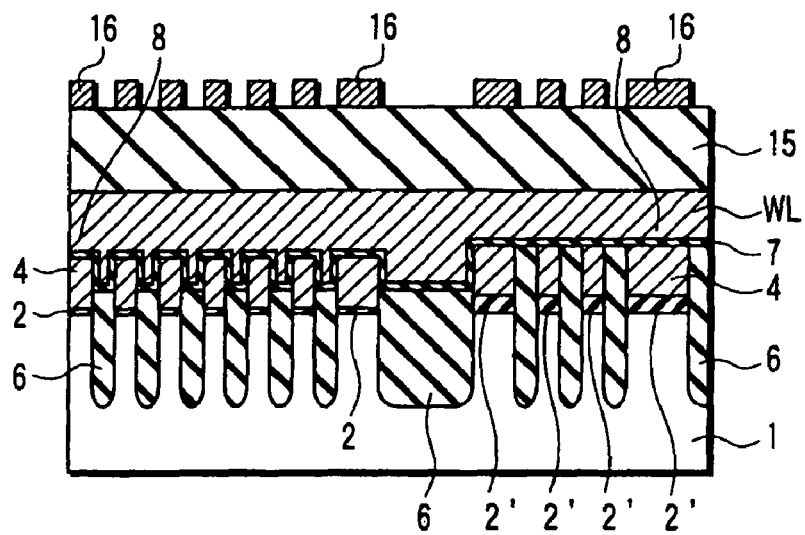
FIG. 23 is a sectional view showing a NAND type flash memory according to a third embodiment of the present invention.

FIG. 23 is a sectional view showing a NAND type flash memory according to a third embodiment.

The present embodiment is different from the second embodiment in that an upper surface of the isolation insulating film 6 in the wide trench existing at a boundary between the tunnel gate insulating film 2 and the tunnel gate insulating film 2' is lowered. However, if the upper surface of the isolation film 6 comes to lower position than the upper surfaces of the tunnel insulating films 2 and 2', the tunnel insulating films 2 and 2' contact the control gate 8 and world line WL, so that the upper surface of the isolation film 6 in the wide width trench is set higher position than the upper surfaces of the tunnel insulating films 2 and 2'.

In the present embodiment as well, the tunnel gate insulating film 2' in the dummy cell region is thicker than the tunnel gate insulating film 2 in the memory cell array region, and thus, the advantageous effect similar to that of the first embodiment is attained.

In addition, according to the present embodiment, the coupling ratio C (=C2/(C1+C2)) increases, so that the leakage current is further reduced. The reason for the increasing of the coupling ratio C is as follows. In the present embodiment, the upper surface of the isolation insulating film 6 in the wide trench existing is lowered, so that the structure that the floating gate electrode 2 is covered with control gate electrode 8 via interelectrode insulating film 7 is obtained, thereby, the capacitance C2 increases, and the coupling ratio C increases.

Figure 24:
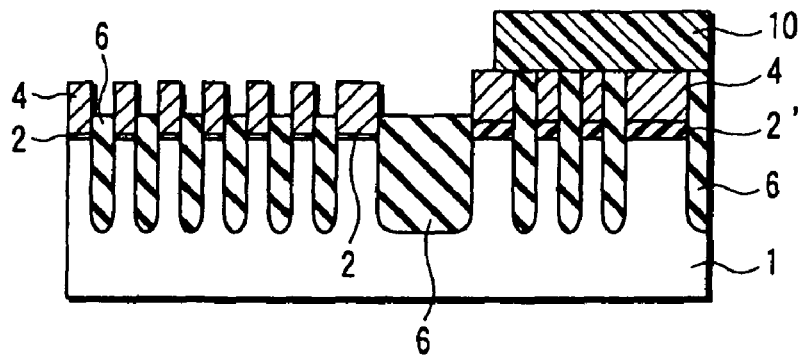
FIG. 24 is a sectional view showing a step of manufacturing the NAND type memory of the third embodiment.
Figure 25:
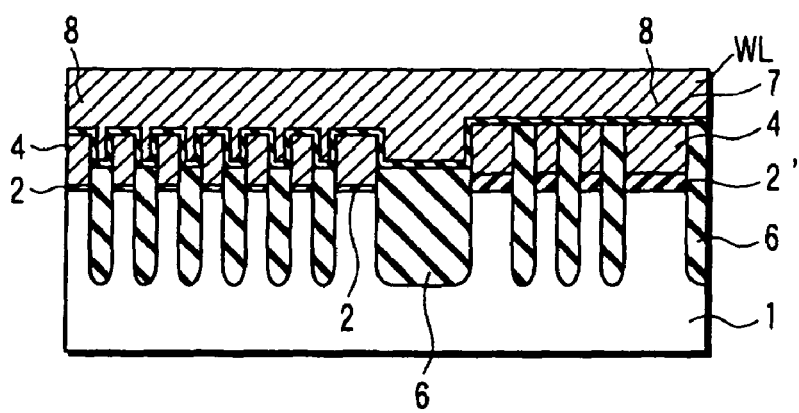
FIG. 25 is a sectional view showing a step of manufacturing the NAND type memory of the third embodiment following the FIG. 24.

FIGS. 24 and 25 are sectional views each showing the step of manufacturing the NAND type flash memory of the present embodiment. The steps common to the NAND type flash memory of the first embodiment will be described with reference to the accompanying drawings used in the first embodiment.

[FIGS. 5 to 13]

At first, the steps shown in FIGS. 5 to 13 described in the first embodiment are carried out.

[FIG. 24]

A resist pattern 10 is formed on a part of the dummy cell region. The resist pattern 10 covers a region of the dummy cell region on which the tunnel gate insulating film 2' is formed. The resist pattern 10 does not cover the wide isolation insulating film 6. With the resist pattern 10 using as a mask, the isolation insulating film 6 is etched whereby a side surface of the upper side of the floating gate electrode 4 on the tunnel gate insulating film 2 is exposed. A part of the side surface of the floating gate electrode 4 on the tunnel gate insulating film 2' adjacent to the wide trench is exposed. The etching of the isolation insulating film 6 is carried out by dry etching process (for example, RIE process). Here, the etching is carried out so that the upper surface of the isolation insulating film 6 in the wide trench is planarized, however, it does not necessarily that the upper surface is to be planarized.

[FIG. 25]

The resist pattern 10 is removed. The gate interelectrode insulating film 7 is formed on the entire surface by CVD process, and the exposed surface (upper surface or side surface) of the floating gate electrode 4 is covered with the gate interelectrode insulating film 7.

Thereafter, the NAND type flash memory shown in FIG. 23 is completed through the well known steps such as the step of forming the control gate electrode 8, the step of forming the interlayer insulating film 15, and the step of forming the bit line 16.

In the present embodiment as well, as in the first embodiment, modifications shown in FIGS. 16, 18, and 19 can be applicable.

Fourth Embodiment

Figure 26:
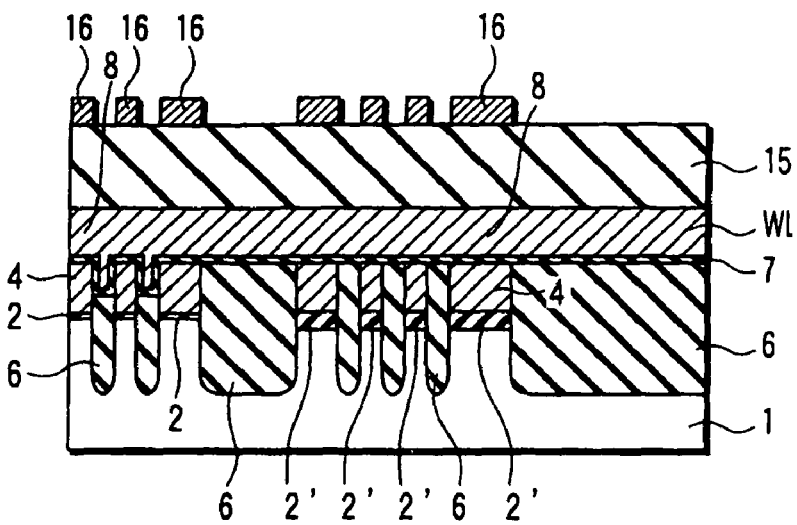
FIG. 26 is a sectional view showing a NAND type memory according to a fourth embodiment of the present invention.
Figure 27:
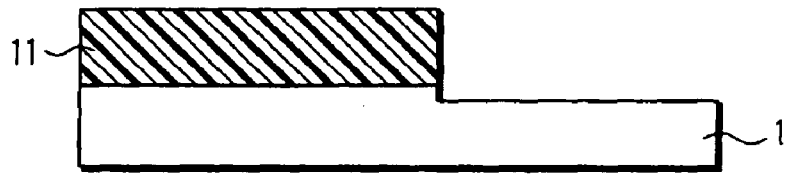
FIG. 27 is a sectional view showing a step of manufacturing the NAND type memory of the fourth embodiment.
Figure 28:
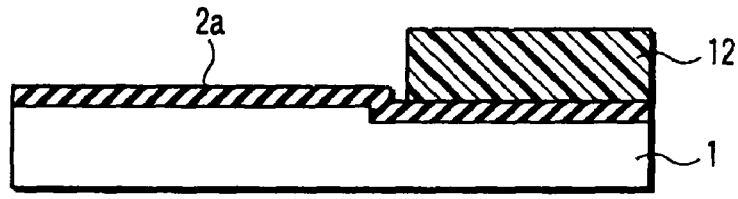
FIG. 28 is a sectional view showing a step of manufacturing the NAND type memory of the fourth embodiment following the FIG. 27.
Figure 29:
FIG. 29 is a sectional view showing a step of manufacturing the NAND type memory of the fourth embodiment following the FIG. 28.
Figure 30:
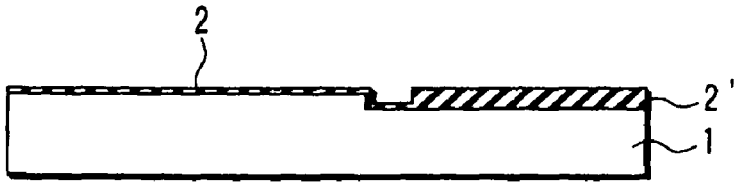
FIG. 30 is a sectional view showing a step of manufacturing the NAND type memory of the fourth embodiment following the FIG. 29.
Figure 31:
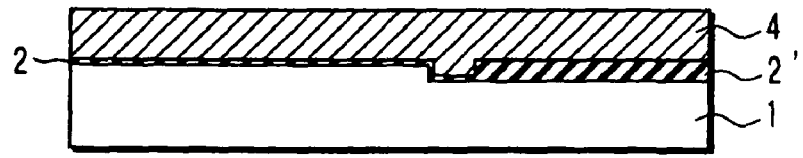
FIG. 31 is a sectional view showing a step of manufacturing the NAND type memory of the fourth embodiment following the FIG. 30.
Figure 32:
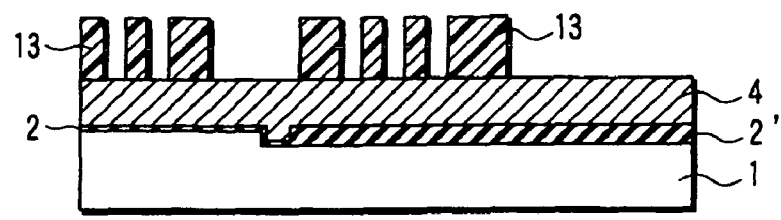
FIG. 32 is a sectional view showing a step of manufacturing the NAND type memory of the fourth embodiment following the FIG. 31.
Figure 33:
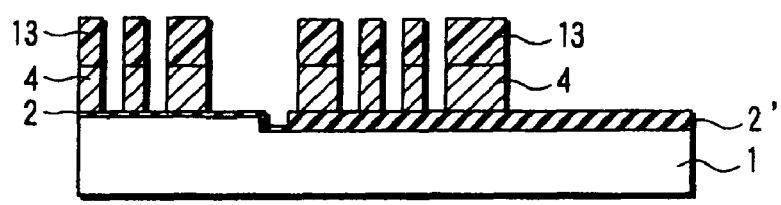
FIG. 33 is a sectional view showing a step of manufacturing the NAND type memory of the fourth embodiment following the FIG. 32.
Figure 34:
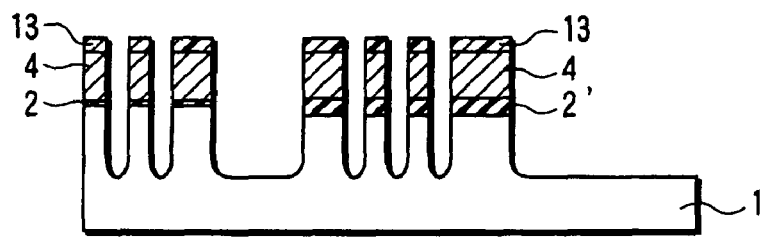
FIG. 34 is a sectional view showing a step of manufacturing the NAND type memory of the fourth embodiment following the FIG. 33.

FIG. 26 is a sectional view showing a NAND type flash memory according to a fourth embodiment of the present invention.

The present embodiment is different from the first to third embodiments in that the surface of the silicon substrate 1 beneath the tunnel gate insulating film 2' in the dummy cell region is located lower than the surface of the silicon substrate 1 beneath the tunnel gate insulating film 2.

In this manner, a distance from a boundary between the tunnel gate insulating film 2' and the silicon substrate 1 to the control gate electrode 8 can be made longer than that of the first to third embodiments.

Therefore, according to the present embodiment, it is possible to improve a withstand voltage of a gate structure (dummy gate structure) including the tunnel gate insulating film 2', the floating gate electrode 4, the gate interelectrode insulating film 7, and the control gate electrode 8 in the dummy cell region.

In addition, as described later, an effect of dishing of the isolation insulating film 6 that occurs at the time of CMP process is also reduced.

In addition, in the present embodiment as well, the tunnel gate insulating film 2' in the dummy cell region is thicker than the tunnel gate insulating film 2 in the memory cell array region, and thus, the advantageous effect similar to that of the first embodiment is attained.

The thickness of the plurality of active areas and the width of a tunnel gate insulating film in the dummy cell region of the present embodiment correspond to those of the second embodiment, however, the dummy gate structure of the present embodiment can be applied to the first and third embodiments, and further, the dummy gate structure can also be applied to the modified examples of the first to third embodiments (FIGS. 16, 18, and 19).

FIGS. 27 to 38 are sectional views each showing the step of manufacturing the NAND type flash memory of the present embodiment.

[FIG. 27]

A resist pattern 11 is formed on the silicon substrate 1. The resist pattern 11 does not cover a region on which the thick tunnel gate insulating film in the dummy cell region is formed. Hereinafter, a region of the silicon substrate 1 beneath the resist pattern 11 is referred to as a first substrate region, and a region of the silicon substrate 1 other than the first substrate region is referred to as a second substrate region.

With the resist pattern 11 using as a mask, the surface of the silicon substrate 1 is etched whereby a step is formed on the surface of the silicon substrate 1. That is, the height of the second substrate region is lowered. The dry etching described above is RIE, for example. The step of the surface of the silicon substrate 1 may be formed by LOCOS process instead of dry etching.

[FIG. 28]

The resist pattern 11 is removed. A tunnel gate insulating film 2a is formed on the surface of the silicon substrate 1. Here, the thickness of the tunnel gate insulating film 2a is 38 nm. A resist pattern 12 is formed on the tunnel gate insulating film 2a on the second substrate region. Among the second substrate region, the resist pattern 12 does not cover a region in the vicinity of a boundary with the first substrate region.

[FIG. 29]

With the resist pattern 12 using as a mask, the tunnel gate insulating film 2a is etched by wet etching whereby the exposed tunnel gate insulating film 2a is removed. At this time, the wet etching is isotropic etching, and thus, the tunnel gate insulating film 2a beneath the resist pattern 12 is slightly removed.

[FIG. 30]

The resist pattern 12 is removed, thereafter, an oxidization process is carried out. This oxidization process forms a tunnel gate insulating film 2 on an exposed surface of the silicon substrate 1. Here, the thickness of the tunnel gate insulating film 2 is 8 nm. At this time, the tunnel gate insulating film 2a (38 nm) formed in advance on the silicon substrate 1 is oxidized by 2 nm. As a result, a tunnel gate insulating film 2' having thickness of 40 nm is formed.

[FIG. 31]

By CVD process, a polycrystalline silicon film 4 including dopants to be processed into a floating gate electrode is formed on the tunnel gate insulating films 2 and 2'. The tunnel gate insulating film 2' is formed on the second substrate region where the substrate surface is lowered, and thus, the flatness of the polycrystalline silicon film 4 is improved.

[FIG. 32]

By lithography process, a resist pattern 13 for forming the floating gate electrode and trench (isolation trench) is formed on the polycrystalline silicon film 4.

[FIG. 33]

With the resist pattern 13 using as a mask, the crystalline silicon film 4 is etched by dry etching whereby the floating gate electrode 4 is formed. The dry etching described above is RIE, for example.

[FIG. 34]

With the resist pattern 13 using as a mask, the tunnel gate insulating film 2 and the silicon substrate 1 are etched whereby the (isolation trench) is formed and the tunnel gate insulating film 2 having a predetermined shape is formed.

[FIG. 35]

The resist pattern 13 is removed. Thereafter, by CVD process and CMP process, the isolation insulating film 6 is embedded in the trench, and the isolation insulating film 6 and the surface of the floating gate electrode 4 are planarized.

Figure 35:
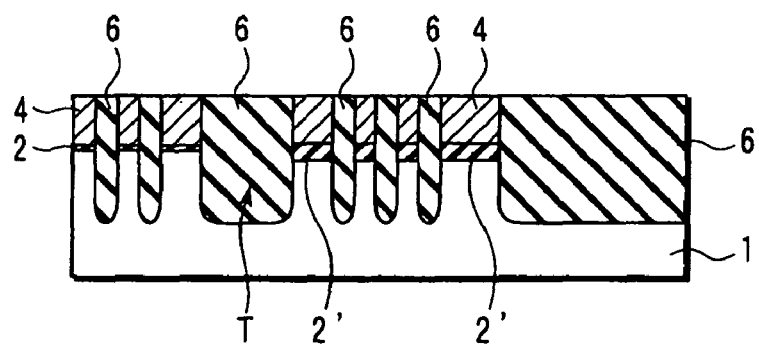
FIG. 35 is a sectional view showing a step of manufacturing the NAND type memory of the fourth embodiment following the FIG. 34.
Figure 36:
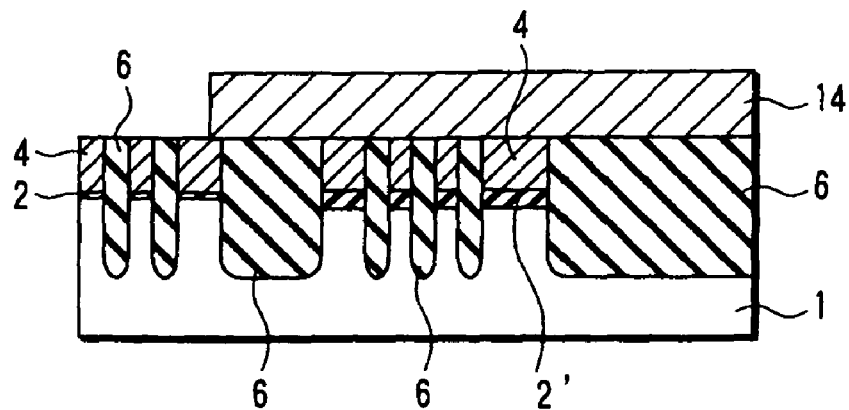
FIG. 36 is a sectional view showing a step of manufacturing the NAND type memory of the fourth embodiment following the FIG. 35.
Figure 37:
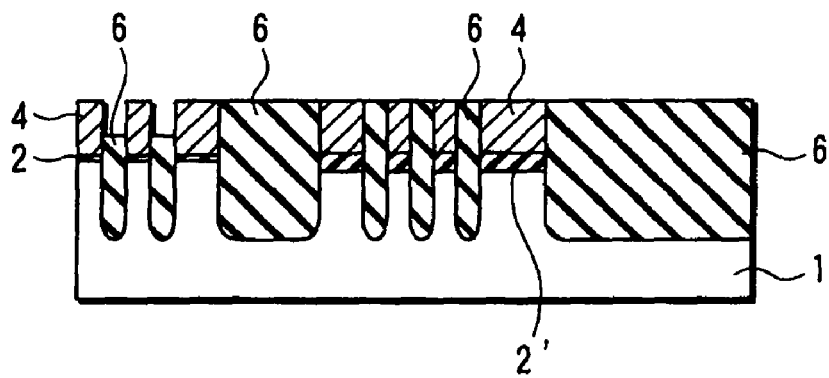
FIG. 37 is a sectional view showing a step of manufacturing the NAND type memory of the fourth embodiment following the FIG. 36.
Figure 38:
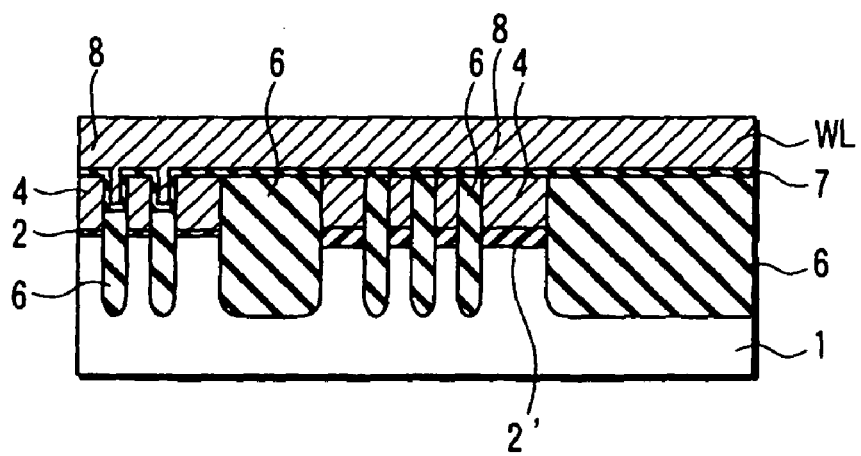
FIG. 38 is a sectional view showing a step of manufacturing the NAND type memory of the fourth embodiment following the FIG. 37.

At the time of CMP process, dishing is prone to occur on the isolation insulating film 6 in the wide trench (for example, trench T shown in FIG. 35). The height of the surface of the isolation insulating film 6 is lowered by the dishing. If the height of the surface of the isolation insulating film 6 is lowered, the distance between the control gate electrode 8 formed on the isolation insulating film 6 where the dishing occurred and the tunnel gate insulating film 2' adjacent to the isolation insulating film 6 where the dishing occurred is reduced. This causes deterioration of withstand voltage.

However, in the case of the present embodiment, the reduction of the distance is lessen by the lowering of the surface of the silicon substrate 1 beneath the tunnel gate insulating film 2'. Thereby, an effect of dishing on the isolation insulating film 2 that occurs during the CMP process is reduced.

[FIG. 36]

A resist pattern 14 is formed on a part of the dummy cell region. The resist pattern 14 covers a region of the dummy cell region on which the tunnel gate insulating film 2' is formed. The resist pattern 14 covers the wide isolation insulating film 6.

[FIG. 37]

With the resist pattern 14 using as a mask, the isolation insulating film 6 is etched whereby the side surface of the upper side of the floating gate electrode on the tunnel gate insulating film 2 is exposed. The etching of the isolation insulating film 6 is carried out by dry etching process (for example, RIE process).

[FIG. 38]

The resist pattern 14 is removed. By CVD process, the gate interelectrode insulating film 7 is formed on the entire surface, and the exposed surface (upper surface or side surface) of the floating gate electrode 4 is covered with the gate interelectrode insulating film 7.

Thereafter, the NAND type flash memory shown in FIG. 26 is completed through the well known steps such as the step of forming the control gate electrode 8, the step of forming the interlayer insulating film 15, and the step of forming the bit line 16.

In the present embodiment as well, as in the first embodiment, the modifications shown in FIGS. 16, 18, and 19 can be applicable.

The present invention is not limited to the embodiments. For example, the embodiments have described a case in which material of the tunnel gate insulating film in the dummy cell region and the material of the tunnel gate insulating film in the memory cell array region is same, they may be different from each other. In this case, the tunnel gate insulating film in the dummy cell region may be thinner than the tunnel gate insulating film in the memory cell array region.

In addition, the embodiments use the silicon substrate, however an SOI substrate may be used. Further, the semiconductor substrate including SiGe may be used instead of the silicon substrate.

In addition, the embodiments have described a case of the NAND type flash memory, the present invention can also be applied to another nonvolatile semiconductor memory.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device comprising:

forming a first gate insulating film and a plurality of second gate insulating films on memory cell and dummy cell regions of a semiconductor device respectively, the first gate insulating film and the plurality of second gate insulating films being different in thickness;

forming a first conductive film on the first gate insulating film and the plurality of second gate insulating films;

forming a resist pattern on the first conductive film;

forming a first floating gate electrode and a plurality of second floating gate electrodes formed of the first conductive film on the first gate insulating film and the plurality of second gate insulating films respectively by etching the first conductive film using the resist pattern as a mask;

forming an isolation trench on a surface of the semiconductor substrate by etching the first gate insulating film, the plurality of second gate insulating films, and the semiconductor substrate using the resist pattern as a mask;

forming an isolation insulating film in the isolation trench;

forming a gate interelectrode insulating film on top surfaces of the first floating gate electrode, the plurality of second floating gate electrodes, and the isolation insulating film;

forming a second conductive film on the gate interelectrode insulating film; and forming a control gate electrode and a word line which are formed of the second conductive film by etching the second conductive film, the control gate electrode being provided above the first floating gate electrode and the plurality of second floating gate electrodes via the gate interelectrode insulating film, the word line being connected to the control gate, wherein the first gate insulating film and the plurality of second gate insulating films are provided beneath the word line, wherein the plurality of second gate insulating films and the plurality of second floating gate electrodes are provided along a direction of the word line, and wherein at least one of the plurality of second floating gate electrodes has a width in the direction of the word line different from ones of the plurality of second floating gate electrodes.

2. The method according to claim 1, wherein the gate interelectrode insulating film is further formed on upper side surfaces of the plurality of second floating gate electrodes.

3. The method according to claim 2, further comprising lowering height of the isolation insulating film.

4. The method according to claim 1, wherein the first gate insulating film and the plurality of second gate insulating films are formed so that the surface of the semiconductor substrate under the plurality of second gate insulating films are at a lower position than the surface of the semiconductor substrate under the first gate insulating film.

* * * * *